US006396865B1

(12) United States Patent
Mawst et al.

(10) Patent No.: US 6,396,865 B1
(45) Date of Patent: May 28, 2002

(54) VERTICAL-CAVITY SURFACE-EMITTING LASERS WITH ANTIRESONANT REFLECTING OPTICAL WAVEGUIDES

(75) Inventors: Luke J. Mawst, Sun Prairie; Delai Zhou, Madison, both of WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/699,050

(22) Filed: Oct. 27, 2000

(51) Int. Cl.$^7$ ............................................... H01S 51/83
(52) U.S. Cl. ........................... 372/96; 257/21; 257/186; 257/187; 372/45; 372/46
(58) Field of Search ............................. 372/45, 46, 96; 257/21, 186, 187

(56) References Cited

U.S. PATENT DOCUMENTS

| 5,086,430 A | | 2/1992 | Kapon et al. |
| 5,255,278 A | | 10/1993 | Yamanaka |
| 5,263,041 A | | 11/1993 | Pankove |
| 5,389,797 A | * | 2/1995 | Bryan et al. .................. 257/21 |
| 6,266,356 B1 | * | 7/2001 | Kaneko ........................ 372/46 |

OTHER PUBLICATIONS

G. Ronald Hadley, "Effective Index Model for Vertical–Cavity Surface–Emitting Lasers," Optics Letters, vol. 20, No. 13, Jul. 1, 1995, pp. 1483–1485.
C. Jung, et al., "4.8 mW Singlemode Oxide Confined Top–Surface Emitting Vertical–Cavity Laser Diodes," Electronics Letters, vol. 33, No. 21, Oct. 9, 1997, pp. 1790–1791.
K.D. Choquette, et al., "Leaky Mode Vertical Cavity Lasers Using Cavity Resonance Modification," Electronics Letters, vol. 34, No. 10, May 14, 1998, pp. 991–992.

Darwin K. Serkland, et al., "Two–Element Phased Array of Antiguided Vertical–Cavity Lasers," Applied Physics Letters, vol. 75, No. 24, Dec. 13, 1999, pp. 3754–3756.

* cited by examiner

Primary Examiner—James W. Davie
Assistant Examiner—Cecil B. Harmon
(74) Attorney, Agent, or Firm—Foley & Lardner

(57) ABSTRACT

A vertical cavity surface emitting semiconductor laser is formed with a multilayer structure on a semiconductor substrate that includes an active region layer, a central core, and an antiresonant reflecting waveguide ring surrounding the central core. The ring includes a region formed to have an effective higher index than the central core and sized to provide antiresonant lateral waveguiding confinement of a fundamental mode wavelength. Reflectors formed above and below the active region layer provide vertical confinement. The antiresonant reflecting ring may be formed either as a full ARROW structure including a quarter wavelength high effective index region and a quarter wavelength low effective index region or as a simplified ARROW structure having a single quarter wavelength high effective index region. The antiresonant reflecting ring provides efficient lateral confinement of the fundamental mode while allowing lateral leakage of higher modes to substantially suppress these modes, resulting in substantially single mode operation at relatively high powers.

22 Claims, 14 Drawing Sheets

VERTICAL-CAVITY SURFACE-EMITTING LASERS WITH ANTIRESONANT REFLECTING OPTICAL WAVEGUIDES

STATEMENT OF GOVERNMENT RIGHTS

This invention was made with United States government support awarded by the following agency: NSF 9734283. The United States government has certain rights in this invention.

FIELD OF THE INVENTION

This invention pertains generally to the field of semiconductor diode lasers and particularly to vertical-cavity surface-emitting lasers.

BACKGROUND OF THE INVENTION

Vertical-cavity surface-emitting lasers (VCSELs) have several significant advantages including low-threshold, high-fiber coupling efficiency, and a compact size that is well suited to integration. Single-mode VCSELs with output powers in the 5–20 mW range would be especially useful for applications such as laser printing (emission wavelength $\lambda$=0.780 $\mu$m) and telecommunications ($\lambda$=1.3–1.55 $\mu$m). Wet-oxidized VCSELs having single-mode power in the 3–5 mW range at $\lambda$=0.85 $\mu$m have been developed. K. D. Choquette, et al., 1997 Summer Topical Meeting on Vertical-Cavity Lasers, Montreal, Quebec, Canada, August, 1997; C. Jung, et al., Electron. Lett. Vol. 33, 1997, pp. 1790 et seq. However, because of their weak (positive-) lateral index-guiding nature, such VCSELs are very susceptible to gain spatial hole burning and thermal waveguiding, making the VCSEL aperture for single-mode operation very limited in size. To date, the highest fundamental-mode cw output power is 4.8 mW from a 3.5-$\mu$m-diameter oxidized VCSEL, achieved by placing the oxide aperture at the optical field standing-wave null position. See, C. Jung, supra.

To obtain higher single-mode powers, the use of a negative-index guide (antiguide) is beneficial. Antiguides have demonstrated high-power, single-mode operation, from edge emitting lasers. D. Botez, et al., Appl. Phys. Lett., Vol. 53, 1998, pp. 464 et seq. More recently, antiguides have been implemented in VCSELs. See, Y. A. Wu, IEEE J. Sel. Top. Quantum Electron., Vol. 1, 1995, pp. 629 et seq.; T. H. Oh, IEEE Photonics Technol. Lett., Vol. 10, 1998, pp. 12 et seq.; K. D. Choquette, et al., Electron. Lett., Vol. 34, 1998, pp. 991 et seq. The advantage of an antiguide structure is that it provides strong lateral radiation losses, which are highly mode dependent, thus filtering out higher order spatial modes (even for large diameter devices, d'>6 $\mu$m). In addition, a large index-step ($\Delta$n>0.05) provides for mode stability against carrier and thermally induced index variations. Antiguided VCSELs have been fabricated either by surrounding a low index core region by regrowth of a high-index material (Y. A. Wu, supra) or by creating a low-index core region by shifting the cavity resonance (toward longer wavelengths) outside of the core (T. H. Oh, supra; K. D. Choquette, Electron. Lett. 34, supra). The latter structure relies on the cavity induced index step as proposed in G. R. Hadley, Opt. Lett., Vol. 20, July 1995, pp. 1483 et seq. These devices display promising results, including single-mode operation up to 5–15×$I_{th}$ for diameters as large as 16 $\mu$m. On the other hand, the power has been limited to less than two mW because of the relatively large radiation loss incurred for the fundamental mode, which is inherent to the antiguide structure. See, R. W. Engelmann, et al., IEEE Proc., Part I: Solid-State Electron Devices, Vol. 127, 1980, pp. 330 et seq.

In addition to the advantages in performance over conventional edge-emitting semiconductor lasers for data communications applications (including low divergence, circular beam, and dynamic single frequency operation), VCSELs also have a simplified fabrication process as compared to edge emitting distributed feedback-type lasers and allow wafer level characterization, which provide significant advantages in the manufacturing of such devices. A shortcoming of current VCSELs is the low power output (2–3 mW) for single-mode operation. Higher power single-mode operation would be desirable for applications ranging from telecommunications sources in the 1.3–1.55 $\mu$m wavelength range to sources for optical recording and digital video disks (DVDs) in the visible wavelength range (630–650 nm).

SUMMARY OF THE INVENTION

Vertical cavity surface emitting semiconductor lasers formed in accordance with the present invention are capable of providing single mode output at higher power and with larger apertures than conventional VCSEL devices. Relatively high power is obtained by efficient lateral waveguiding of the fundamental mode while filtering out higher order spatial modes to achieve substantially single mode operation with less susceptibility to gain spatial hole burning and thermal waveguiding than conventional VCSELs.

The surface emitting semiconductor laser of the invention includes a semiconductor substrate, such as GaAs, and a multilayer structure on the substrate including a layer with an active region at which light emission occurs, upper and lower layers surrounding the active region layer, upper and lower faces, electrodes by which voltage can be applied across the multilayer structure and substrate, a central core region, and an antiresonant reflecting waveguide ring surrounding the central core formed to have an effective higher index than the central core and sized to provide antiresonant lateral waveguiding confinement of a fundamental mode lateral wavelength. An upper reflector is formed above the ring and active region layer and a lower reflector is formed below the active region layer to provide vertical confinement. The reflecting ring and the upper and lower reflectors are positioned to act upon the light generated in the active region to produce lasing action and emission of light from at least one of the upper and lower faces of the semiconductor laser. Typically, one of the reflectors, which are preferably formed as multiple layer distributed Bragg reflector mirrors, is partially transmissive to allow passage of light therethrough to, e.g., the upper face of the laser. The antiresonant reflecting waveguide ring can be formed to have a full ARROW structure including a high effective index region of odd multiples of a quarter lateral wavelength (including a single quarter lateral wavelength) and a low effective index region of odd multiples of a quarter lateral wavelength, or to have a simplified ARROW structure having a single high effective index region of odd multiples of a quarter lateral wavelength. The high effective index regions in the reflecting ring are preferably formed to locally increase the cavity resonance wavelength to provide an effective equivalent increase in the index in the ring. The structure further preferably includes a means for confining the current from the electrodes to the central core region, such as by use of proton implantation in the region surrounding the central core for the simplified ARROW structure or by utilizing a current blocking layer in the epitaxial structure that laterally surrounds the central core region and the reflecting ring. In addition, lossy layers can be placed in the reflector regions to suppress the guided modes of the ring waveguides.

The semiconductor laser of the invention may be formed with various material systems commonly used in semiconductor lasers. The active region is preferably formed to be aluminum free, e.g., as a multiple quantum well active region formed of layers of GaAs and InGaAs. The higher effective index region of the reflecting ring may be formed for such a material system of, e.g., layer of GaInP and a layer of GaAs.

Further objects, features and advantages of the invention will be apparent from the following detailed description when taken in conjunction with the accompanying drawings.

DETAILED DESCRIPTION OF THE INVENTION

In the present invention, an antiresonant reflecting optical waveguide (ARROW) is utilized for lateral confinement in a surface emitting laser diode structure to reduce the edge radiation losses for the fundamental mode. In an embodiment of the invention having a full ARROW structure, a low-index core region is surrounded by a reflecting ring comprised of a pair of quarter lateral wave reflector regions that are designed to be antiresonant for the fundamental mode. Higher-order modes, which do not meet the antiresonant condition, suffer large lateral radiation losses and are suppressed. Improved modal discrimination is obtained with the ARROW structure that favors the fundamental mode. Such a structure permits a large built-in lateral index step with a relatively large spot size (e.g., greater than 10 $\mu$m diameter), which is suitable for high-power single-mode operation. The invention may also be embodied utilizing a simplified version of the ARROW structure (referred to as S-ARROW), which is obtained by taking out the low-index outer-reflector regions of the ARROW structure. The S-ARROW structure has been found theoretically to be less sensitive to gain-spatial-hole burning than the conventional ARROW structure. See, e.g., I. V. Goltser, et al., Opt. Lett., Vol. 20, 1995, pp. 2219 et seq.

Figure 1:
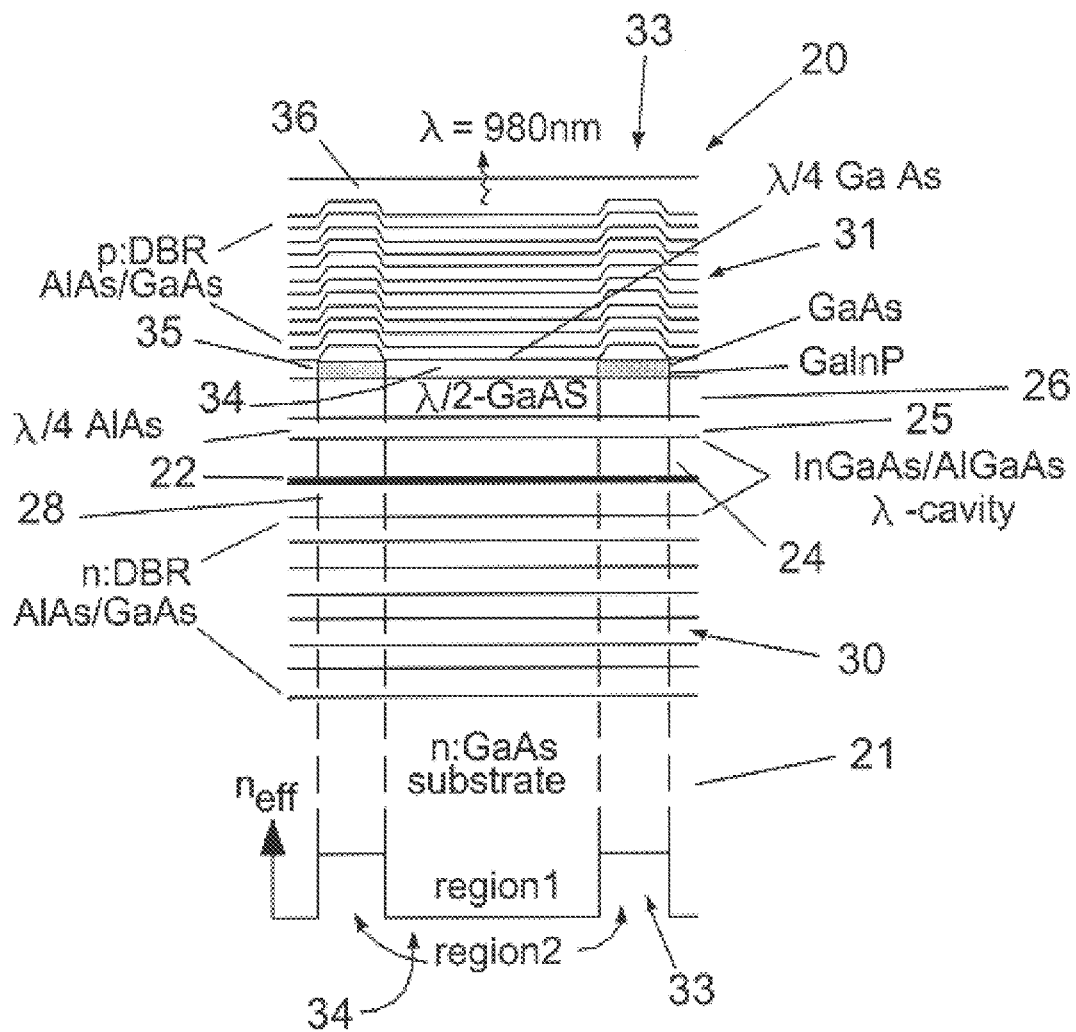
FIG. 1 is a schematic diagram of the structure of example of a 980 nm S-ARROW VCSEL in accordance with the invention.

To illustrate the principles of the invention, an exemplary S-ARROW VCSEL structure is shown generally at 20 in FIG. 1, with a diagram of the lateral effective refractive index profile $n_{eff}$. The VCSEL structure 20 includes a substrate 21 (n-type GaAs) on which is formed multiple layers including an active region layer 22 surrounded by upper layers 24, 25, 26 and a lower layer 28, a lower distributed Bragg reflector 30, an upper distributed Bragg reflector 31, and a contact layer 36. An antiresonant reflecting optical waveguide ring surrounds a central core 34 in the multilayer structure. A ring layer 35 (e.g., formed of layers of GaInP and GaAs, as shown) provides the lateral variation of effective refractive index for the waveguide ring 33. FIG. 1 effectively illustrates a cross-section of the structure. The ring 33 and ring layer 35 are preferably circular but may be other closed forms, e.g., squares, etc.

Figure 2:
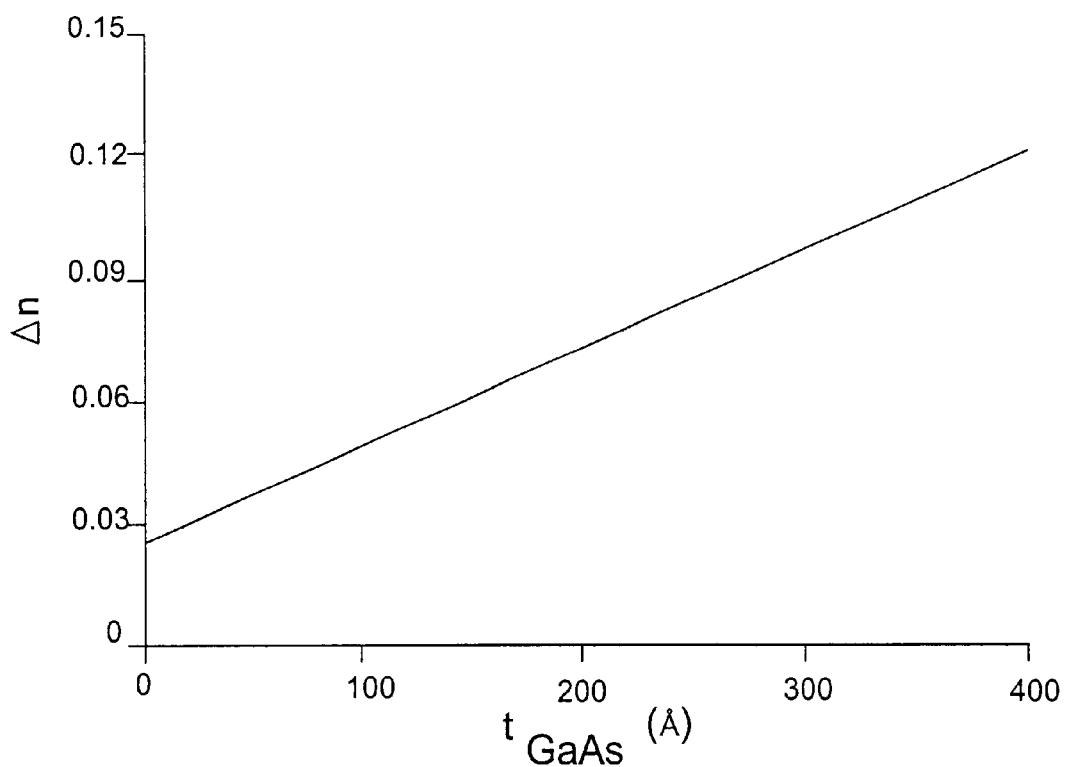
FIG. 2 is a diagram showing the effective refractive index step as a function of the thickness of the GaAs spacer layer for the 980 nm VCSEL shown in FIG. 1, with $t_{GaInP}$=12 nm.

The lateral waveguide can be created by locally shifting the cavity resonance toward longer wavelengths in the ring 33 (region 1) surrounding the emitting aperture (region 2 in FIG. 1). Hadley, supra, has shown than an increase in the resonant wavelength is equivalent to an increase of effective index according to the approximate relation; $\Delta n/n = \Delta\lambda/\lambda$. FIG. 2 shows the calculated effective-index step between the low-index core region (region 1 in FIG. 1) and the surrounding (effective) high-index reflector ring region (region 2 in FIG. 1) for the S-ARROW VCSEL structure, as a function of the thickness of the GaAs spacer layer in the ring 33 (the underlying GaInP layer thickness is fixed at 12 nm for the calculations shown in FIG. 2). In this structure, the lateral index step $\Delta n$ is designed to be in the range 0.05–0.1, corresponding to a GaAs thickness of 11–33 nm (see FIG. 2), which is a sufficiently large value to ensure mode stability. For a given $\Delta n$, a one-dimensional (1D) model can be used to estimate the width s of the reflecting ring 33 which will satisfy the antiresonance condition: $s = m\lambda_1/4$, where m is an odd integer and $\lambda_1$ is the lateral wavelength in the high-index region 2. In this example, devices with a reflector width of 2 $\mu$m are utilized, corresponding to $\sim 5/4\lambda_1$. Further optimization to achieve the antiresonance condition for specific cases can be carried out using an accurate 3D VCSEL waveguide calculation.

Figure 3:
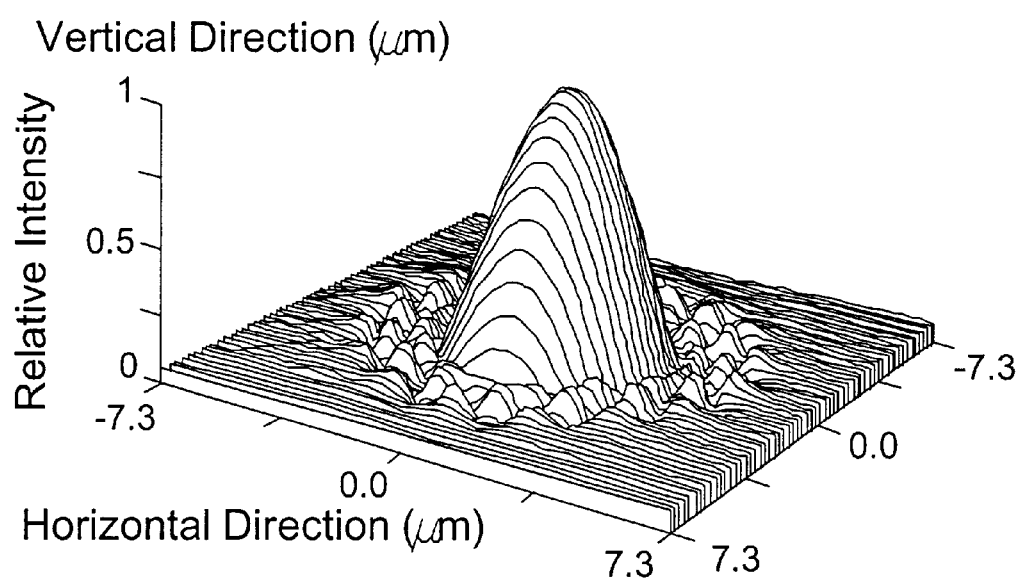
FIG. 3 is an illustrative diagram showing the calculated fundamental mode intensity profile of a 6 $\mu$m diameter S-ARROW VCSEL for an effective refractive index step of 0.05, with the reflector regions corresponding to an optical thickness of $5/4\lambda_1$ where $\lambda_1$ is the lateral wavelength of the radiation leakage.
Figure 4:
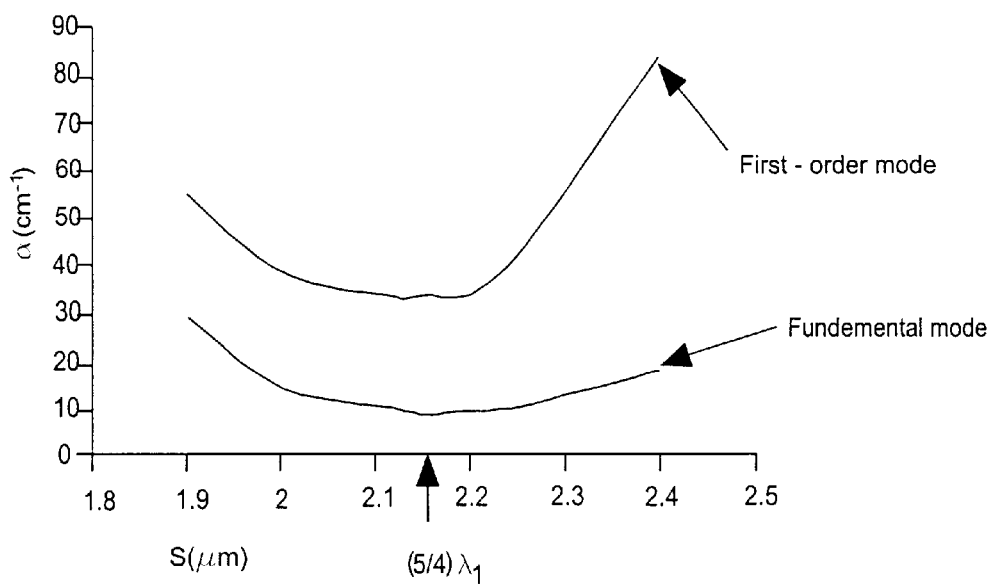
FIG. 4 are diagrams showing the calculated modal loss as a function of reflector width, with the antiresonant point which corresponds to $5/4\lambda_1$ illustrating a low fundamental-mode loss and high modal discrimination.

As an approximation to an exact 3D VCSEL simulation, the lowest order modes (for 6 μm diameter, Δn=0.05) of the S-ARROW VCSEL were simulated using an effective index model and fiber-mode approximation, and the calculated fundamental mode intensity profile is illustrated in FIG. 3. As expected, the modal loss for the fundamental mode is significantly reduced (9 vs 47 cm$^{-1}$) compared with that of a single antiguide of the same diameter and index step. Furthermore, since the higher-order mode loss remains large in the S-ARROW structure, the ratio of the fundamental mode loss to the first-order mode loss is increased to ~4 (compared with ~2.5 for a single-antiguide structure). The modal loss as a function of the reflector width s was calculated and is shown in FIG. 4. The chosen antiresonance design point ($5/4\lambda_1$) corresponds to the lowest loss region for the fundamental mode. In addition, as seen in FIG. 4, a relatively large region exists around the antiresonance point where strong high-order mode discrimination occurs while the loss is still low for the fundamental mode. Further away from antiresonance, higher mode discrimination is achieved at the expense of higher fundamental mode loss. Similar behavior occurs for a larger index-step structure (i.e., Δn=0.1) although lower values of edge losses will occur.

A preferred fabrication process for the S-ARROW VCSEL 20 involves a two-step low pressure metal organic chemical vapor deposition (MOCVD) growth at 700° C. After the first growth, involving layers up to and including the GaInP(12 nm) and GaAs(33 nm) layers that will define the ring 33, processing is carried out to photoresist pattern the wafer, with the use of selective chemical etching to form the ring reflector 33. The second growth involves the regrowth of the top p-type distributed Bragg reflector (DBR) 31 and p+GaAs contact layer 36. Proton implantation is then carried out to confine the current to the central low-index core region (region 1). Finally, metal liftoff is used to open a window in the metal contact (not shown in FIG. 1) for light output.

Figure 8:
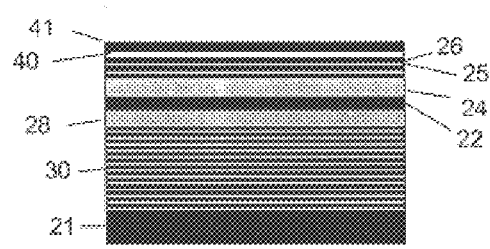
FIG. 8 is a schematic diagram illustrating an MOCVD growth step for growing thin GaInP and GaAs layers in the fabrication of the S-ARROW VCSEL device of FIG. 7.
Figure 9:
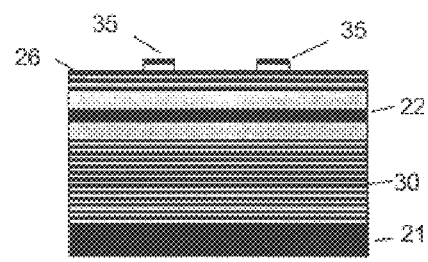
FIG. 9 is a diagram as in FIG. 8 showing the structure after a further step of wet etching to form the index step.
Figure 10:
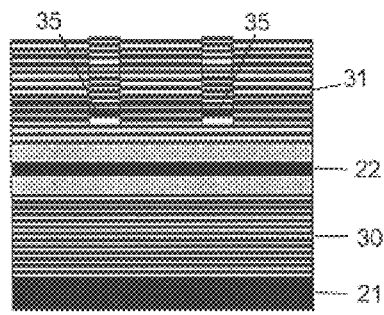
FIG. 10 is a diagram as in FIG. 9 illustrating the further MOCVD regrowth of the top distributed Bragg reflector.
Figure 11:
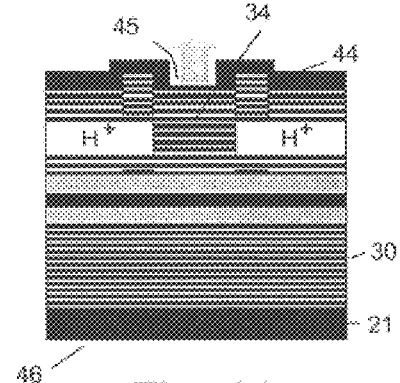
FIG. 11 is a diagram as in FIG. 10 illustrating the further step in the fabrication of the device of proton implantation and the formation of a top metal contact.

The fabrication of the S-ARROW VCSEL device 20 is illustrated with respect to FIGS. 8–11. In an initial step, MOCVD is used to grow the various layers on the GaAs substrate 21 up to a GaInP layer 40 and a GaAs layer 41, as shown in FIG. 8. A wet etch with $H_3PO_4:H_2O_2:H_2O$ and $HCl:H_2O$ is then performed to etch the layers 40 and 41 to leave the index-step ring 33 as illustrated in FIG. 9. The layers forming the upper DBR 31 are then grown by MOCVD as illustrated in FIG. 10. Proton implantation (240 KeV/3×10$^{14}$ cm$^{-3}$) in the region surrounding the core region 34 is then carried out as illustrated in FIG. 11, and a metal contact layer 44 (Ti:Pt:Au) is then deposited. The top metal contact is opened in a central region 45 to form the emitting aperture of the device. Another metal contact layer 46 may also be formed on the bottom of the substrate 21 to provide a bottom electrode which, with the top electrode 44, may be used to apply current to the device.

Figure 5:
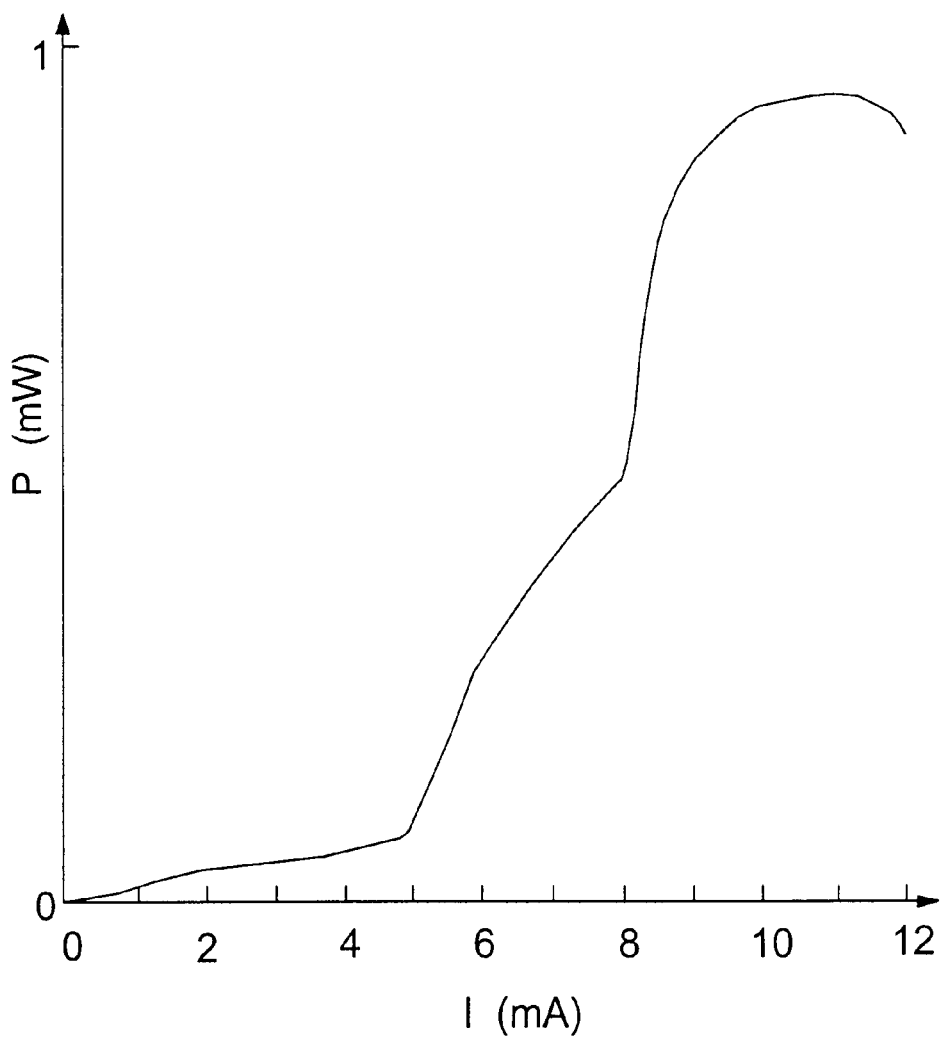
FIG. 5 is a diagram of the measured cw P-I curve of an S-ARROW VCSEL as in FIG. 1 with a 12-$\mu$m diameter aperture.
Figure 6:
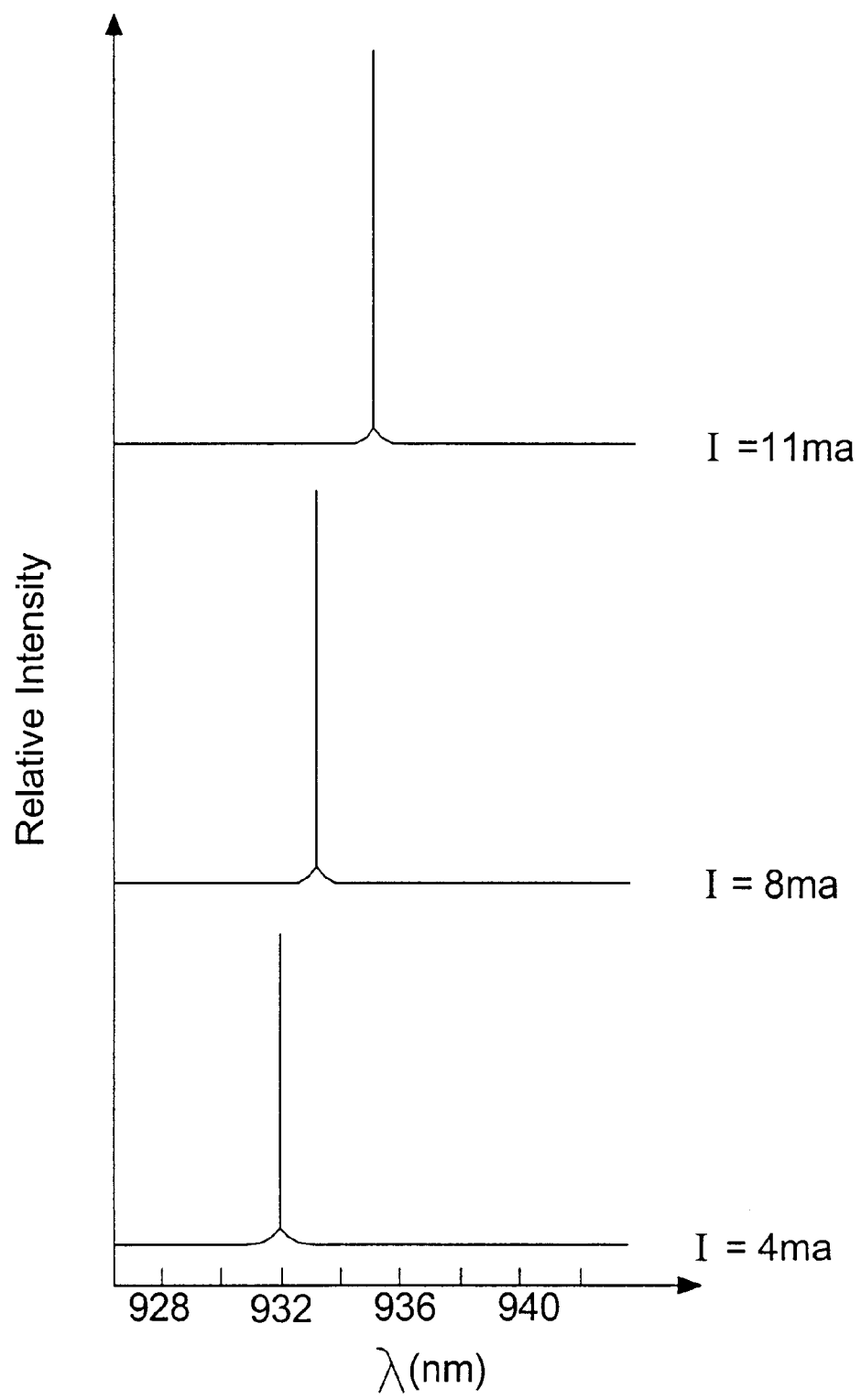
FIG. 6 are diagrams illustrating the measured cw spectrum of a 12-$\mu$m diameter S-ARROW device as in FIG. 1 at device current levels of 4 mA, 8 mA and 11 mA.

Initial devices were fabricated with an index step Δn=0.05, corresponding to a GaAs spacer thickness of 11 nm. Near-field and spectral studies on these devices indicate lasing occurs first for the low-loss guided modes of the reflector ring. At higher injection currents, the leaky modes of the low-index core regions reach threshold. In order to achieve lasing only in the leaky modes of the structure, the antiguiding edge losses need to be reduced. To reduce the edge losses for the leaky modes, a higher index step (Δn=0.1) design was implemented. Preliminary results obtained for devices with 12-μm-diameter core regions and a larger index step of 0.1 are shown in FIGS. 5 and 6. Threshold currents are 4.5 mA with single-mode operation (FIG. 6) up to ~mW cw output power until thermal rollover occurs at ~3×$I_{th}$ (12 mA). As shown in FIG. 5, a kink is observed in the power-current (P-I) characteristics at ~9 mA, however, the multimode operation does not occur, as evident from the spectral characteristics (FIG. 6) and far-field radiation pattern (full width half maximum=10°). The kink and thermal rollover observed in the P-I characteristics are believed to be a consequence of the strong device heating due to an unoptimized p-type DBR 31 ($V_{th}$~4 V). In addition, misalignment of the gain peak (λ~950 nm) with the resonant wavelength (λ~930 nm) also leads to premature thermal rollover. Further optimization of the voltage drop in the p-type DBR and alignment of the gain and cavity can be carried out to lead to a considerable increase in single-mode power. The lateral index step may be optimized to ensure single-mode operation to high powers (>10 mW from 12 μm diameter).

Figure 7:
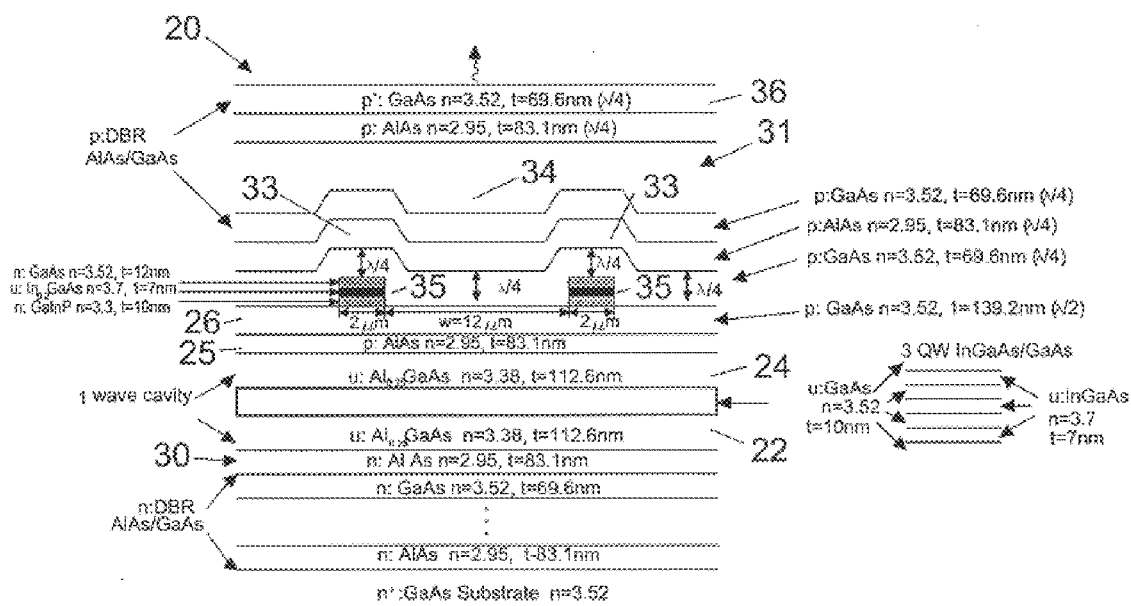
FIG. 7 is a detailed diagram illustrating the layer thicknesses and constituents for an exemplary 980 nm S-ARROW VCSEL device of the type shown in FIG. 1.

A detailed diagram showing layer thicknesses, indices, and constituents for an exemplary 980 nm S-ARROW VCSEL device as in FIG. 1 is shown FIG. 7. The values for the index of GaInP and AlGaInP are taken from Peter S. Zory, "*Quantum Well Lasers*, Academic Press, 1993, page 442, and the values for the index of AlGaAs and AlAs are taken from Casey and Panish, *Heterostructure Lasers*, Part A: Fundamental Principles, Academic Press, 1978, page 44. As illustrated in FIG. 7, the lower DBR 30 is composed of alternating layers of n-type AlAs and GaAs, and the upper DBR 31 is formed of alternating layers of p-type AlAs and GaAs, the upper wave cavity layer 24 and lower wave cavity layer 28 are formed of AlGaAs, the layer 25 is formed of p-type AlAs, the layer 26 of p-type GaAs, and the active region layer 24 is a three quantum well structure formed of layers of InGaAs between GaAs. An additional layer of, e.g., InGaAs can be formed in the ring layer 35 between the layers of GaAs and GaInP to introduce absorption loss into the reflector ring 33 to help suppress the guided modes. A p$^+$ layer of GaAs forms the contact layer 36. The width "s" of the high index region 33 is preferably selected to obtain the highest intermode discrimination. Typically, s is about 1.0 to 2.5 μm.

Figure 12:
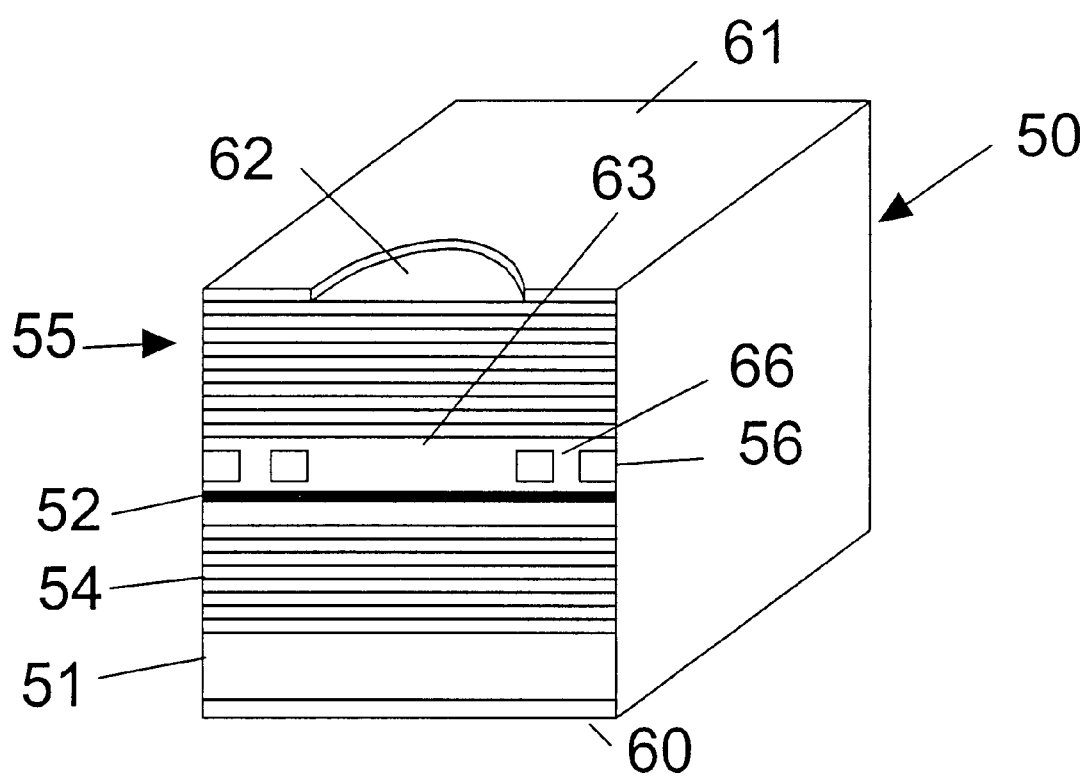
FIG. 12 is an illustrative perspective view of an ARROW VCSEL device in accordance with the invention.
Figure 13:
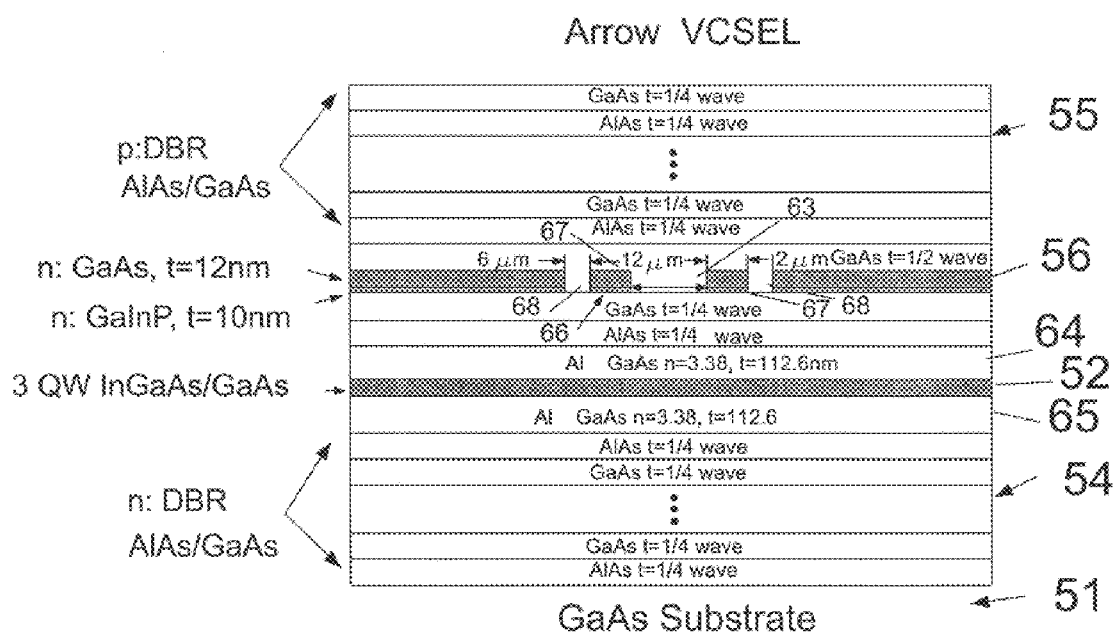
FIG. 13 is a diagram illustrating the constituent layers of the ARROW VCSEL device of FIG. 12.

The present invention may also be incorporated in a full ARROW type structure as illustrated generally at 50 in FIG. 12 and in more detail in FIG. 13. The device 50 has a substrate 51 (n-type GaAs as illustrated), a quantum well active region layer 52, a lower distributed Bragg reflector mirror 54, an upper distributed Bragg reflector mirror 55, and a high index guide layer 56 in which the ARROW reflecting ring structure 66 is formed about a core region 63. A bottom metal contact electrode layer 60 is formed on the bottom of the substrate 51, and a top metal electrode layer 61 is formed on the top surface as the upper electrode, with an opening 62 being formed therein to define the emitting aperture. A detailed diagram of the multilayer structure formed on the GaAs substrate (which may be deposited by MOCVD in the same manner as for the device 20 as discussed above) is shown in FIG. 13. The lower DBR mirror 54 is formed of alternating layers of n-type AlAs and GaAs (e.g. 35 to 40 pairs of layers), and the upper DBR mirror 55 is formed of alternating layers of p-type AlAs and GaAs. The active region layer 52 may be formed as shown of three quantum well layers of InGaAs with adjoining layers of GaAs, and with upper and lower wave cavity layers 64 and 65 formed of AlGaAs. The high index guide layer 56 may be formed as shown of a layer of GaInP and a layer of GaAs. A layer of InGaAs can be added to the layers of GaInP and GaAs to introduce absorption loss in the reflector ring. Proton implantation into the multilayer structure is utilized to confine current primarily to the central core 63. Any other means for confining current to the core region may be used, one example of which is a current blocking layer. The ARROW reflecting ring structure 66 is formed of a ring of high index region 67 surrounded by a ring of low index GaAs region 68 which separates the ring region 67 from the rest of the layer 56. The widths of the regions 67 and 68 are selected to provide the desired antiresonant condition for the ARROW structure.

Figure 14:
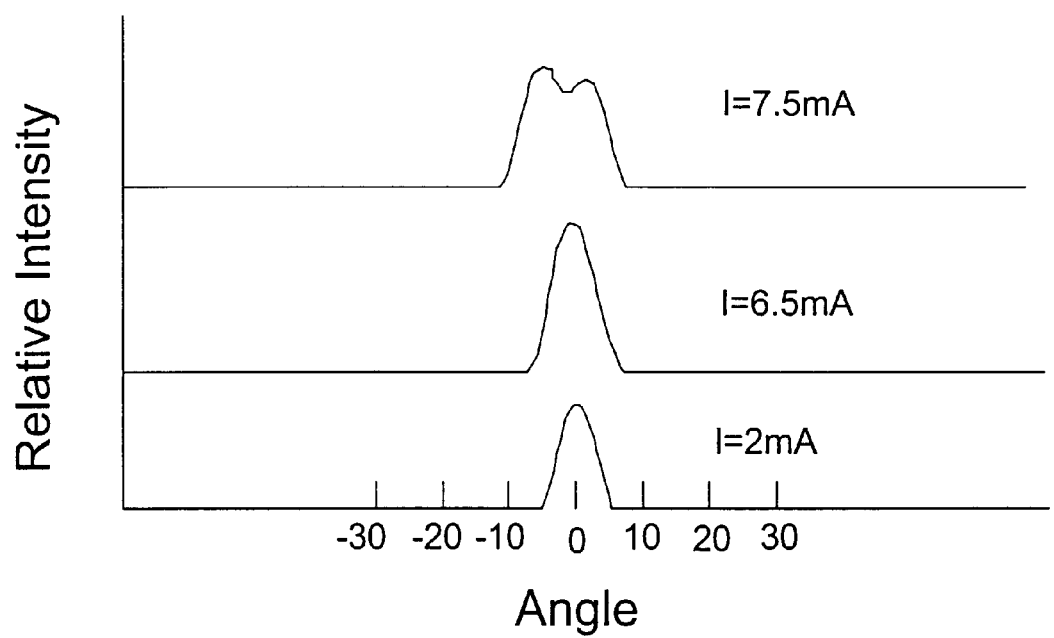
FIG. 14 are diagrams of measured far-field radiation patterns for a 12 $\mu$m wide core ARROW VCSEL at three different drive currents.

ARROW-VCSELs fabricated using the resonance cavity shift design showed CW threshold currents of 1.5–2.0 mA for devices having a 12 µm-wide core region. Single-mode (mode 4) operation is observed from Ith=1.5 mA up to 4×Ith (0.75 mW), above which mode 7 reaches threshold. CW far-field measurements are shown in FIG. 14 as a function of drive current. The lobe width broadens from 6.5° at Ith to 7.5° at 4×Ith due to self-focusing of mode 4. In FIG. 14, I=2 mA and 6.5 mA (4×Ith) correspond to mode 4; I=7.5 mA corresponds to a mixture of modes 4 and 7.

Figure 15:
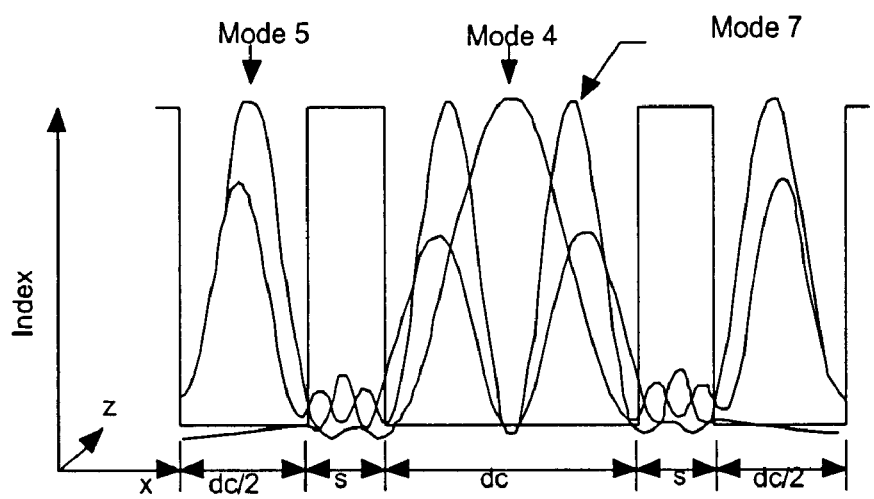
FIG. 15 is a cross-sectional view of the lateral index profiles and modes for the ARROW structure.
Figure 16:
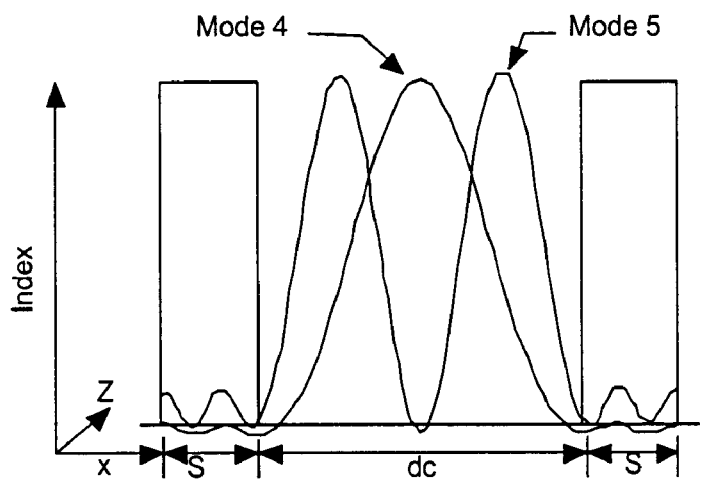
FIG. 16 is a cross-sectional view of the lateral index profiles and modes for the S-ARROW structure.

A cross-sectional view of the lateral effective index variation and calculated low-order leaky modes supported by the circular ARROW and S-ARROW VCSEL structures are shown in FIGS. 15 and 16, respectively. Mode 4 corresponds to the fundamental leaky-mode for both structures (where the mode number reflects the number of intensity nulls in the mode profile). For the S-ARROW, mode 5 is the competing high-order mode. By contrast, in the ARROW structure mode 7 is the lowest loss (competing) high-order mode.

Figure 17:
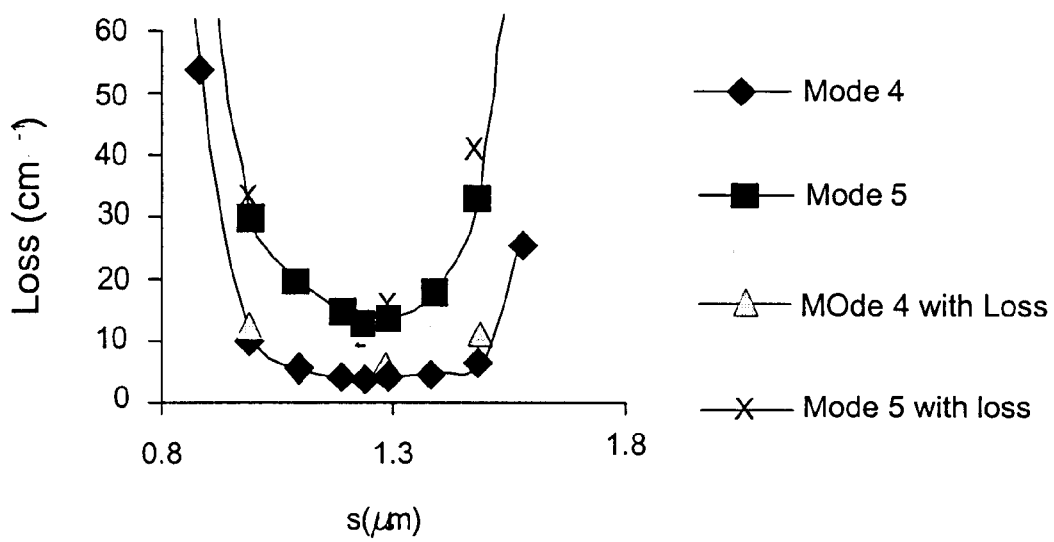
FIG. 17 are diagrams of calculated mode dependent lateral radiation losses for the ARROW structure.
Figure 18:
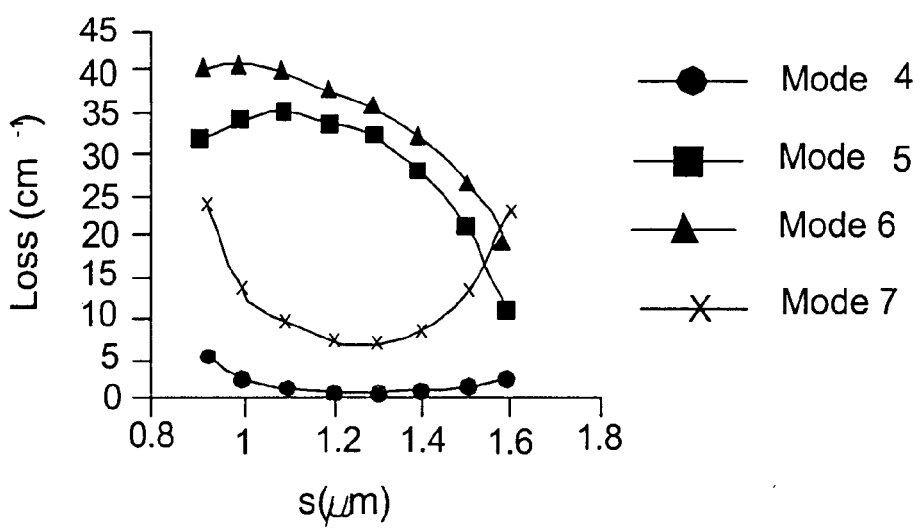
FIG. 18 are diagrams of calculated mode dependent lateral radiation losses for the S-ARROW structure.

The computed modal radiation losses for the ARROW and S-ARROW structures, as a function of reflector width (s) for an 8 µm-wide low index core region, are shown in FIGS. 17 and 18, respectively. For the S-ARROW structure, only modes 4 and 5 are relevant, since higher-order modes have very large radiation losses. The antiresonance point, at s=1.3 µm, corresponds to an optical thickness of $\frac{3}{4}\lambda_1$, where $\lambda_1$ is the lateral radiation wavelength. Absorption loss (100 cm$^{-1}$) placed in the high index reflector regions is effective in suppressing the guided modes of the reflector ring, while having little impact on the leaky modes, as shown in FIG. 17. The advantage of the ARROW structure, over the S-ARROW, is extremely low loss for the fundamental mode (mode 4).

The material systems discussed above are for exemplification of the invention only, and the invention may be utilized with other semiconductor laser materials, e.g., InP-based materials for the 1.3–1.55 µm wavelength range. Other types of reflectors may be utilized for vertical confinement rather than distributed Bragg reflectors, e.g., dielectric mirrors.

Figure 19:
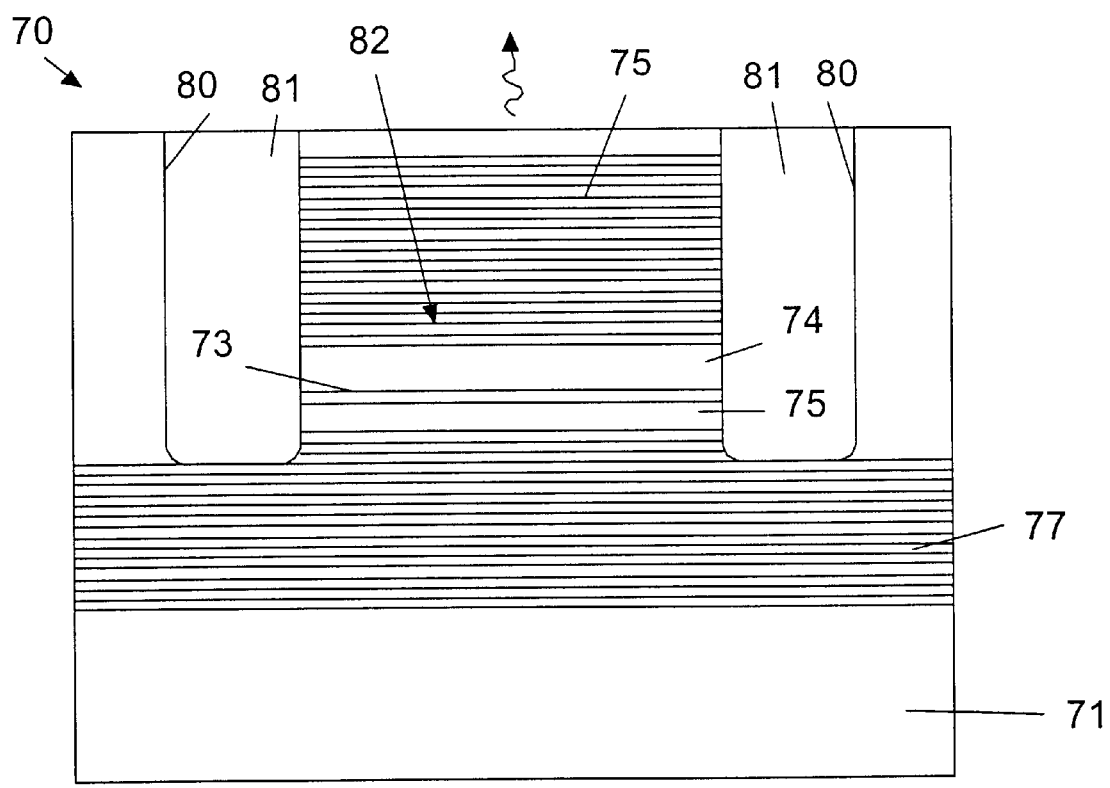
FIG. 19 is a simplified cross-sectional view of another S-ARROW VCSEL in accordance with the invention having a high index ring formed by etch and regrowth.

An example of another S-ARROW VCSEL structure, that can be formed by etch and regrowth, is shown at 70 in FIG. 19. In the device 70, a multilayer structure formed on a substrate 71 includes an active region layer 73 surrounded by cavity layers 74 and 75, an upper DBR reflector 76 and a lower DBR reflector 77. For example only, these structures may be formed as shown in FIG. 7. A trench 80 is etched in the multilayer structure down to the lower DBR 75, and the trench is then filled with a high index material 81 by regrowth. The material used to fill the cylindrical ring 81 is selected to have a higher index than the effective index of the core region 82 and the width of the ring is chosen to provide the antiresonant waveguide for reflecting the fundamental mode. As an example, for the materials of FIG. 7, Al$_x$GaAs may be used for the regrowth material 81 with x less than 0.25 where the layers 74 and 75 are formed of Al$_{0.25}$GaAs.

It is understood that the invention is not confined to the particular embodiments set forth herein as illustrative, but embraces such forms thereof as come within the scope of the following claims:

What is claimed is:

1. A vertical cavity surface-emitting semiconductor laser comprising:

a semiconductor substrate and a multilayer structure on the substrate including a layer with an active region at which light emission occurs, upper and lower layers surrounding the active region layer, upper and lower faces, electrodes by which voltage can be applied across the multilayer structure and the substrate, a central core, an antiresonant reflecting waveguide ring surrounding the central core having a region formed to have an effective higher index than the central core, the waveguide ring providing antiresonant lateral waveguiding confinement of a fundamental mode lateral wavelength, an upper reflector above the active region layer and a lower reflector below the active region layer, the reflecting ring and the upper and lower reflectors positioned to act upon the light generated in the active region to produce lasing action and emission of light from at least one of the upper and lower faces of the semiconductor laser, and including means for confining the current from the electrodes to the central core.

2. The semiconductor laser of claim 1 wherein the means for confining the current to the central core comprises proton implantation in regions of the multilayer structure surrounding the central core.

3. The semiconductor laser of claim 1 wherein the electrodes are formed on the upper and lower faces of the semiconductor laser and the upper electrode has an opening formed therein above the central core to define the output aperture of the semiconductor laser.

4. The semiconductor laser of claim 1 wherein the material of the higher effective index region of the reflecting ring is selected to locally increase the cavity resonance wavelength to provide an effective equivalent increase in the index in the ring.

5. The semiconductor laser of claim 1 wherein the reflecting ring comprises a full ARROW structure including a high index region of odd multiples of a quarter lateral wavelength effective index region and a low effective index region of odd multiples of a quarter lateral wavelength.

6. The semiconductor laser of claim 1 wherein the reflecting ring comprises a simplified ARROW structure having a single high effective index region of odd multiples of quarter lateral wavelength.

7. The semiconductor laser of claim 1 wherein the upper and lower reflectors are distributed Bragg reflectors.

8. The semiconductor laser of claim 7 wherein the upper distributed Bragg reflector is formed of multiple pairs of layers of p-type AlAs and GaAs and the lower distributed Bragg reflector is formed of multiple pairs of layers of n-type AlAs and GaAs.

9. The semiconductor laser of claim 1 wherein the substrate is formed of GaAs, the upper and lower reflectors are distributed Bragg reflectors formed of multiple pairs of layers of AlAs and GaAs, the active region layer is a multiple quantum well structure formed of layers of GaAs and InGaAs, and wherein the higher effective index region of the reflecting ring includes a quarter lateral wavelength section formed by insertion of a layer of GaInP and a layer of GaAs.

10. The semiconductor laser of claim 1 wherein the reflecting ring is formed by etch and regrowth as a ring of high index material surrounding the central core.

11. A vertical cavity surface-emitting semiconductor laser comprising:

a semiconductor substrate and a multilayer structure on the substrate including a layer with an active region at which light emission occurs, upper and lower layers surrounding the active region layer, upper and lower faces, electrodes by which voltage can be applied across the multilayer structure and the substrate, a central core, an antiresonant reflecting waveguide ring surrounding the central core having a region formed to have an effective higher index than the central core and sized to provide antiresonant lateral waveguiding confinement of a fundamental lateral mode wavelength, wherein the reflecting ring comprises a full ARROW structure including a high effective index region of odd multiples of a quarter lateral wavelength and a low effective index region of odd multiples of a quarter lateral wavelength, and wherein the material of the reflecting ring is selected to locally increase the cavity resonance wavelength to provide an effective equivalent index increase in the high effective index region, an upper reflector above the active region layer and a lower reflector below the active region layer, the reflecting ring and the upper and lower reflectors positioned to act upon the light generated in the active region to produce lasing action and emission of light from at least one of the upper and lower faces of the semiconductor laser, and means for confining the current from the electrodes to the central core.

12. The semiconductor laser of claim 11 wherein the means for confining the current to the core region comprises proton implantation in regions of the multilayer structure surrounding the central core.

13. The semiconductor laser of claim 11 wherein the electrodes are formed on the upper and lower faces of the semiconductor laser and the upper electrode has an opening formed therein above the central core to define the output aperture of the semiconductor laser.

14. The semiconductor laser of claim 11 wherein the upper and lower reflectors are distributed Bragg reflectors.

15. The semiconductor laser of claim 14 wherein the upper distributed Bragg reflector is formed of multiple pairs of layers of p-type AlAs and GaAs and the lower distributed Bragg reflector is formed of multiple pairs of layers of n-type AlAs and GaAs.

16. The semiconductor laser of claim 11 wherein the substrate is formed of GaAs, the upper and lower reflectors are distributed Bragg reflectors formed of multiple pairs of layers of AlAs and GaAs, the active region layer is a multiple quantum well structure formed of layers of GaAs and InGaAs, and wherein the higher effective index region of the reflecting ring includes a quarter lateral wavelength section formed by insertion of a layer of GaInP and a layer of GaAs.

17. A vertical cavity surface-emitting semiconductor laser comprising:

a semiconductor substrate and a multilayer structure on the substrate including a layer with an active region at which light emission occurs, upper and lower layers surrounding the active region layer, upper and lower faces, electrodes by which voltage can be applied across the multilayer structure and the substrate, a central core, an antiresonant reflecting waveguide ring surrounding the central core having a region formed to have an effective higher index than the central core and sized to provide antiresonant lateral waveguiding confinement of a fundamental lateral mode wavelength, wherein the reflecting ring comprises a simplified ARROW structure having a single high effective index region of odd multiples of a quarter lateral wavelength, wherein the material of the reflecting ring is selected to locally increase the cavity resonance wavelength to provide an effective equivalent increase in the index in the ring, an upper reflector above the active region layer and a lower reflector below the active region layer, the reflecting ring and the upper and lower reflectors positioned to act upon the light generated in the active region to produce lasing action and emission of light from at least one of the upper and lower faces of the semiconductor laser, and means for confining the current from the electrodes to the central core.

18. The semiconductor laser of claim 17 wherein the means for confining the current to the central core comprises proton implantation in regions of the multilayer structure surrounding the central core.

19. The semiconductor laser of claim 17 wherein the electrodes are formed on the upper and lower faces of the semiconductor laser and the upper electrode has an opening formed therein above the central core to define the output aperture of the semiconductor laser.

20. The semiconductor laser of claim 17 wherein the upper and lower reflectors are distributed Bragg reflectors.

21. The semiconductor laser of claim 20 wherein the upper distributed Bragg reflector is formed of multiple pairs of layers of p-type AlAs and GaAs and the lower distributed Bragg reflector is formed of multiple pairs of layers of n-type AlAs and GaAs.

22. The semiconductor laser of claim 17 wherein the substrate is formed of GaAs, the upper and lower reflectors are distributed Bragg reflectors formed of multiple pairs of layers of AlAs and GaAs, the active region layer is a multiple quantum well structure formed of layers of GaAs and InGaAs, and wherein the higher effective index region of the reflecting ring includes a quarter lateral wavelength section formed by insertion of a layer of GaInP and a layer of GaAs.

* * * * *